(12) United States Patent
Katsuro et al.

(10) Patent No.: US 6,867,968 B2
(45) Date of Patent: Mar. 15, 2005

(54) ELECTRONIC CONTROL UNIT

(75) Inventors: Hajime Katsuro, Nagoya (JP); Akihiro Mizutani, Nagoya (JP)

(73) Assignee: Denso Corporation, Kariya (JP)

( * ) Notice: Subject to any disclaimer, the term of this patent is extended or adjusted under 35 U.S.C. 154(b) by 49 days.

(21) Appl. No.: 10/316,023

(22) Filed: Dec. 11, 2002

(65) Prior Publication Data

US 2003/0117776 A1 Jun. 26, 2003

(30) Foreign Application Priority Data

Dec. 26, 2001 (JP) ........................................ 2001-394689

(51) Int. Cl.[7] .............................................. H05K 7/20
(52) U.S. Cl. ...................... 361/690; 361/600; 361/679; 361/705; 361/707; 361/715; 361/816
(58) Field of Search .......................... 165/80.3; 361/600, 361/679, 688–690, 694–695, 715, 728, 730, 752, 757, 800, 816, 818; 454/184; 174/16.3

(56) References Cited

U.S. PATENT DOCUMENTS

| 4,204,247 A | * | 5/1980 | Wigley ......................... 361/706 |
| 5,461,541 A | * | 10/1995 | Wentland et al. ............ 361/707 |
| 5,469,328 A | * | 11/1995 | Palaszewski ................. 361/690 |
| 5,844,777 A | * | 12/1998 | Gates ........................... 361/700 |
| 6,507,494 B1 | * | 1/2003 | Hutchison et al. ........... 361/704 |

FOREIGN PATENT DOCUMENTS

| JP | 54-155471 | 12/1979 |
| JP | 56-12798 | 2/1981 |
| JP | 59-219996 | 12/1984 |
| JP | 61-158957 | 10/1986 |
| JP | 4-84496 | 3/1992 |
| JP | 8-204070 | 8/1996 |
| JP | 9-275169 | 10/1997 |
| JP | 2001-156474 | 6/2001 |
| JP | 2001-210980 | 8/2001 |
| JP | 2003-86979 | 3/2003 |

* cited by examiner

*Primary Examiner*—Gregory Thompson
(74) *Attorney, Agent, or Firm*—Nixon & Vanderhye P.C.

(57) ABSTRACT

An electronic control unit installed on a high temperature heat source or in its vicinity exhibits an improved heat dissipation ability within its installation environment. The electronic control unit has a chassis incorporating a printed circuit board where electronic devices are mounted. The outer surface of the chassis on the side of the high temperature heat source has a coating for lowering infrared absorption, while the outer surface of the chassis on the side away from the high temperature heat source has a coating for enhancing heat emissivity. Preferably, the inner surfaces of the chassis are subject to a surface treatment for increasing infrared absorption.

23 Claims, 7 Drawing Sheets

ELECTRONIC CONTROL UNIT

CROSS REFERENCE TO RELATED APPLICATION

This application is based upon, claims the benefit of priority of, and incorporates by reference the contents of prior Japanese Patent Application 2001-394689 filed on Dec. 26, 2001.

BACKGROUND OF THE INVENTION

1. Field of the Invention

This invention relates to electronic control units, and more specifically, to electronic control units that are located in, or in the vicinity of, a high temperature heat source such as an internal combustion engine.

2. Description of the Related Art

Generally, electronic control units, such as those working as control devices for use with internal combustion engines on vehicles, have circuit boards on which are mounted heat dissipating devices such as semiconductor switching devices. These circuit boards are housed in a chassis made of metallic materials such as aluminum alloys. Such electronic control units maintain the heat dissipating devices at temperatures below a predetermined temperature by conducting heat generated during circuit board operation from the inside of the circuit board to the outside of the chassis.

In prior art configurations, because the surface of the metal components forming the chassis is a natural metallic surface, the amount of heat transfer to the chassis from the heat dissipating devices mounted on the circuit board is small.

In recent years, there has been a need to develop a technique for decreasing the size of the engine compartment, for resource savings and other purposes, and installing engine components in the compartment in a concentrated fashion. Whether or not they are mounted on a high temperature heat source such as an internal combustion engine, electronic control units are expected to be compact and dissipate heat efficiently. However, the component structure can become complex and sufficient installation space must be ensured if the heat transfer from heat dissipating devices to the chassis is to be realized by heat conduction via the circuit board, for example. It then becomes difficult to reduce the size of the electronic control unit.

SUMMARY OF THE INVENTION

It is, therefore, an object of the invention to provide an electronic control unit that can be installed on a high temperature heat source, or in its vicinity, that exhibits an improved heat dissipation ability within its installation environment.

According to a first aspect of the present invention, in an electronic control unit installed on or in the vicinity of a high temperature heat source and comprising a chassis incorporating a circuit board where electronic devices are mounted, the outer surface of the chassis on the side facing the high temperature heat source is subject to a surface treatment for decreasing the infrared absorption coefficient. The outer surface of the chassis on the side away from the high temperature heat source is subject to a surface treatment for increasing heat emissivity.

Then the heat transfer by radiation to the chassis from a high temperature heat source such as an internal combustion engine can be lowered, while the heat transfer to the side away from the high temperature source can be augmented. As a result of the decreased heat transfer from an external high temperature source or a high temperature substance and the increased heat transfer to the side away from the high temperature substance, the heat dissipation from the chassis can be accelerated. For example, the electronic devices such as semiconductor switching devices mounted on the circuit board of an electronic control unit can be efficiently cooled.

According to a second aspect of the present invention, the high temperature heat source is an internal combustion engine of which the thermal load changes with operating conditions.

Namely, the chassis structure is designed to reflect its installation location relative to the high temperature heat source so as to efficiently dissipate heat to the outside of the electronic control unit produced during circuit operation. Thus this electronic control unit is suitable for the internal combustion engine of which the thermal loads suddenly change, for example, when the vehicle runs uphill or is left at idle after running at a high rpm level.

According to a third aspect of the present invention, one of the surfaces of the chassis is a natural surface of the material forming the chassis and the other surface is subject to a predetermined surface treatment. It then becomes possible to provide an inexpensive chassis that decreases heat transfer from the high temperature substance and increases heat transfer from the chassis to the side opposite to the high temperature substance.

According to a fourth aspect of the present invention, the outer surfaces of the chassis are subject to surface treatments different from each other. Then it becomes possible to increase heat transfer from the chassis to an area outside of the chassis as well as to decrease heat transfer from the high temperature substance and to increase heat transfer to the side opposite to the high temperature substance. For example, the natural metallic surface, which has a low infrared absorption coefficient, of the metal composing the chassis may be treated with a white coating for low infrared absorption and high emissivity. Because heat transfer from the chassis to an area outside of the chassis is enhanced, heat dissipation from the chassis can be further accelerated.

According to a fifth aspect of the present invention, the inner surface of the chassis is subject to a surface treatment for increasing the infrared absorption coefficient. Then the heat transfer to the chassis by radiation from the heat dissipating electronic devices, such as semiconductor switching devices mounted on the circuit board of the electronic control unit, is accelerated. As a result, the device temperature can be lowered.

According to a sixth aspect of the present invention, in the chassis surfaces on the side facing the high temperature heat source, an area in surface contact with another component is subject to a surface treatment for decreasing heat conduction, while in the chassis surfaces on the side away from the high temperature heat source, an area in surface contact with another component is subject to a surface treatment for increasing heat conduction.

It then becomes possible to decrease heat transfer from the high temperature heat source to the chassis and at the same time increase heat transfer from the chassis to the side away from the high temperature heat source when heat moves from the high temperature heat source to the chassis. For example, the chassis can be partitioned into a plurality of segments and the segments can be efficiently cooled.

According to a seventh aspect of the present invention, the chassis has a first housing unit holding the circuit board and a second housing unit incorporating the circuit board in combination with the first housing unit.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Now the electronic control unit of the invention will be described with reference to the accompanying drawings along with specific embodiments where the device is installed in the engine compartment or in the engine of a vehicle to control the engine that drives the vehicle. The following description of the preferred embodiments is merely exemplary in nature and is in no way intended to limit the invention, its application, or uses.

[First Embodiment]

Figure 1:
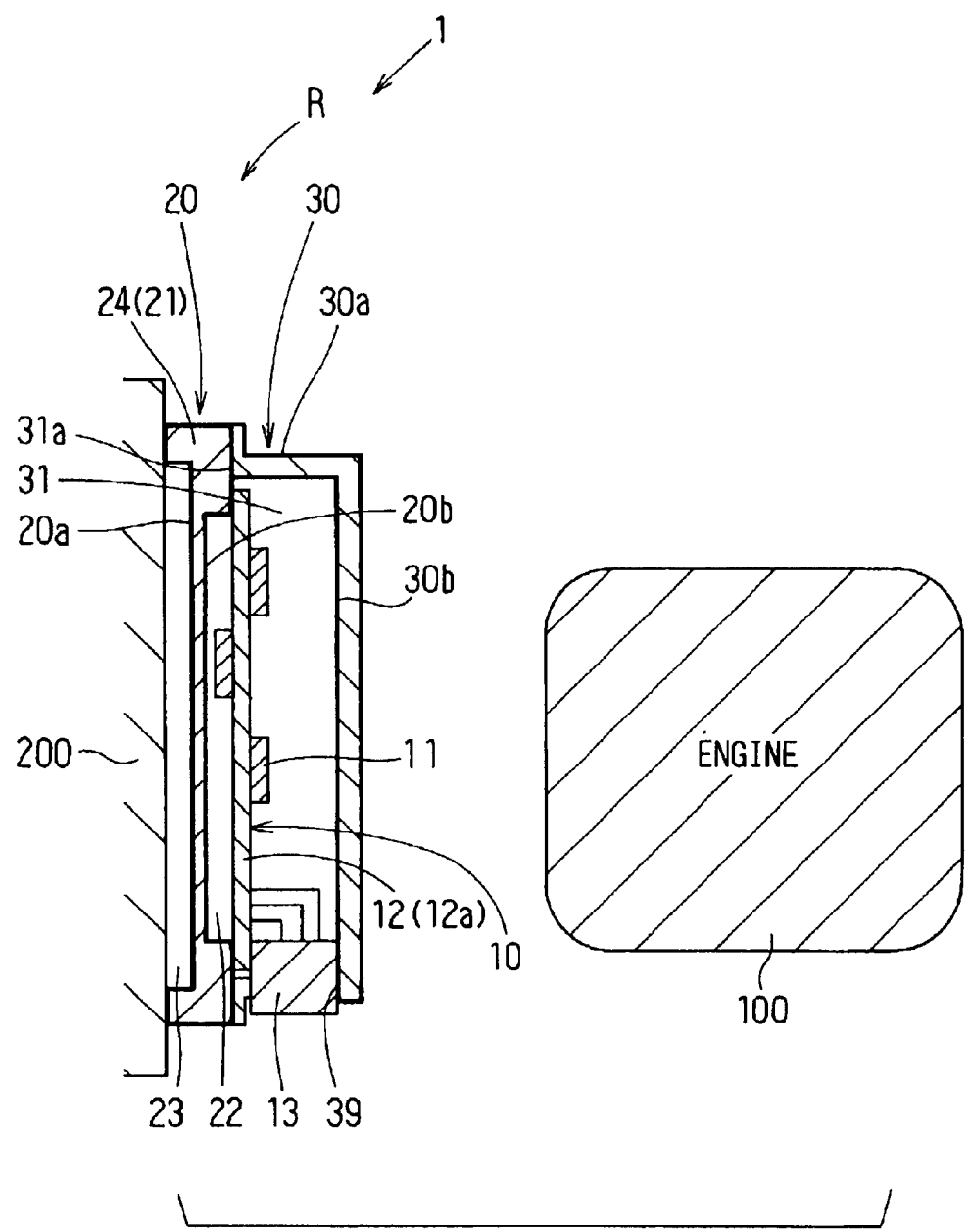
FIG. 1 is a cross-sectional view illustrating the structure of the electronic control unit in accordance with a first embodiment of the invention.
Figure 2:
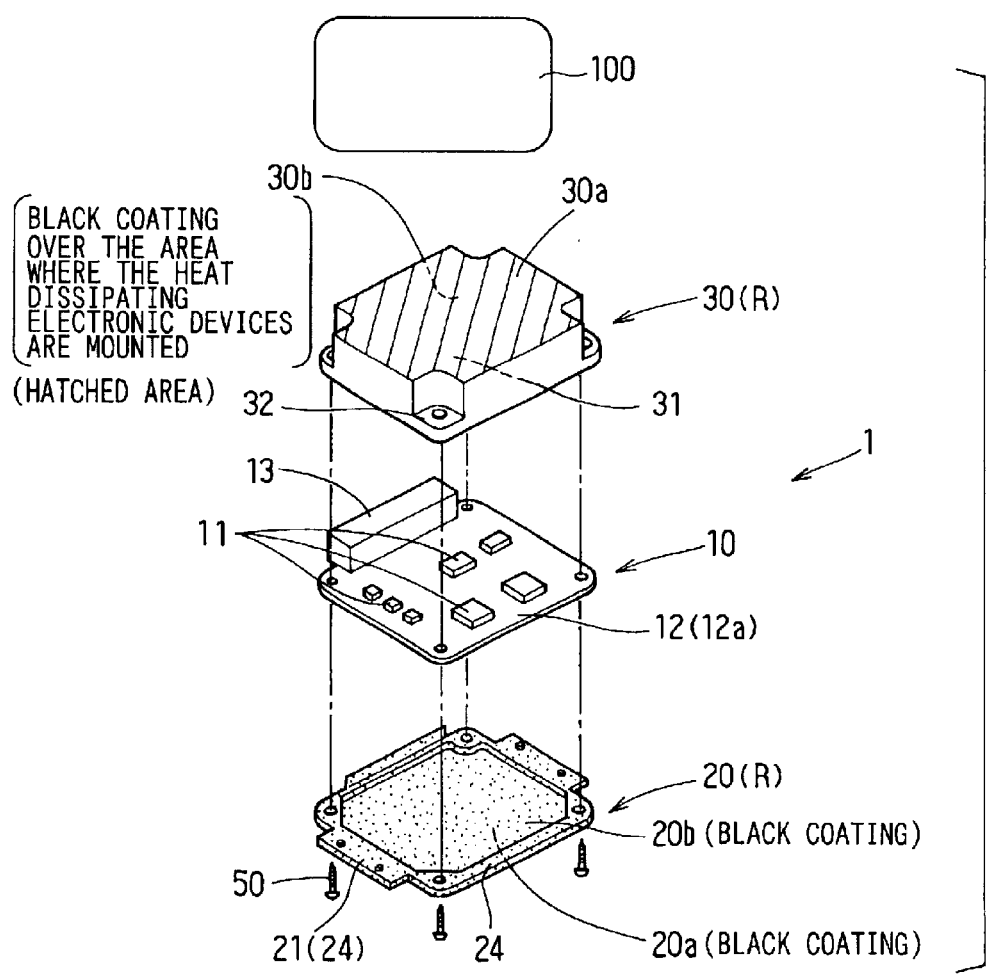
FIG. 2 is an exploded perspective view of the electronic control unit of FIG. 1.

FIG. 1 is a cross-sectional view of an electronic control unit according to a first embodiment of the invention, and FIG. 2 is an exploded perspective view of the electronic control unit of FIG. 1.

As shown in FIG. 1 and FIG. 2, the electronic control unit 1 comprises a circuit board 10 on which are mounted electronic devices 11 such as IC and semiconductor devices, a first housing unit 20 holding the circuit board 10 where these electronic devices 11 are mounted, and a second housing unit 30 incorporating the circuit board 10 in combination with the first housing unit 20. The electronic control unit, which is a control device that controls internal combustion engines and the like, conducts the PWM (pulse width modulation) or PFM (pulse frequency modulation) control on known fuel injection means (not shown) for injecting fuel into the internal combustion engine in response to its rotation speed, load and other factors. The electronic control unit also controls well-known ignition means (not shown) for igniting the fuel injected into the internal combustion engine. Thus some of the electronic devices 11, which are mounted on the circuit board 10, are heat dissipating components such as semiconductor switching devices. The electronic control unit 1 may be an electronic control unit (ECU) that controls internal combustion engines, the electric motors of electric vehicles, and motors such as dynamos. The electronic control unit 1 of the present invention, however, is installed in the vicinity of a high temperature heat source 100 (high temperature component) such as an internal combustion engine or an electric motor.

The electronic control unit 1 used in the present embodiment is an ECU that controls an internal combustion engine 100, and is installed in the vicinity of the internal combustion engine 100 in a first embodiment (the case where the ECU is mounted on the internal combustion engine 100 will be explained in a separate description of another embodiment).

The circuit board 10 (hereafter, referred to as "printed circuit board") comprises electronic devices 11 including heat dissipating devices such as semiconductor switching devices and a substrate 12 on which the electronic devices 11 are mounted. The substrate 12 comprises a dielectric base material 12a and circuits (not shown) formed on the surface or inside the dielectric base material 12a. These circuits are electrically connected with the electronic devices 11. The printed circuit board 10 has a connector 13 to connect to an external system to exchange signals with the electronic devices 11.

The first housing unit 20, hereafter, referred to as "cover," and the second housing unit 30, hereafter, referred to as "case," together serving as the chassis R of the electronic control unit 1, are made of metallic materials such as aluminum and aluminum alloy casts. The case 30 has an opening in the bottom, and the cover 20 is formed into approximately a plate-like unit that caps the bottom opening 31 (see FIG. 1) of the case 30. The case 30 and the cover 20 are assembled to sandwich the printed circuit board 10 on which the connector 13 is mounted. The cover 20 and the case 30 are not limited to only be manufactured as casts, but may also be formed by stamping. The case 30 has a window 39 for a connector so that the printed circuit board 10 can receive power and exchange signals with external systems through the connector 13.

The details of the structure of the chassis R, for improved heat dissipation when the chassis R is in the vicinity of a high temperature heat source or an internal combustion engine 100, will be described later. As shown in FIG. 2, a base 32 is formed in each of the four corners of the case 30 so as to receive the printed circuit board 10. The base 32 and the cover 20 are screwed together via the printed circuit board 10 with a screw 50, or the like, so as to sandwich the printed circuit board 10 between the case 30 and cover 20. The cover 20 and the case 30 may be mated together, other than by using screws 50 or the like, such as (for example) by fitting hooks (not shown) formed on the case 30 into apertures (not shown) formed in the standing walls of the cover, or alternatively by adhering the cover and the case together with an adhesive.

For convenience of explanation, in this embodiment the cover 20 and the case 30 are assumed to be mated together with screws. The bottom 31a forming the bottom opening 31 of the case 30 may be configured so that the cover 20 and the case 30 contact each other (see FIG. 1).

As shown in FIG. 2, the cover 20 has a mounting base 21 extending outwardly from the cover 20 so that the case 30, and the cover 20 serving in combination as the chassis R of the electronic control unit 1, can be mounted on the internal combustion engine 100 or the body 200 of a vehicle (in FIG. 2, mounted on the vehicle body). This mounting base 21 is fastened to the desired target, such as the internal combustion engine 100, with screws or the like. A step 22 is formed in the center of the cover 20 on the side facing the printed circuit board 10. This step 22 is deep enough so as not to interfere with the electronic devices mounted on the printed circuit board 10. On the other hand, a step 23 (hereafter, referred to as "clearance") is formed on the side facing the vehicle body 200, as shown in FIG. 1. By virtue of this clearance 23, the outer periphery 24 (particularly the mounting base 21) of the cover 20, as opposed to the entire bottom face of the cover 20, makes secured contact with the target when the device is mounted on an internal combustion engine 100 or a vehicle body 200, both of which usually have contoured surfaces rather than flat surfaces. The cover 20 having clearance 23 can be fastened to the target via the outer periphery 24.

Now a major aspect of the present invention, that is, the structure of the chassis R (specifically case 30 and cover 20) for accelerating heat dissipation in the vicinity of a high temperature heat source or an internal combustion engine 100, will be described. Referring now to FIG. 1, the matrix of metallic materials, including aluminum alloys, forming the chassis R is exposed as is on the outer surface 30a. This, in turn, is part of the outer faces (specifically the outer surface 30a of the case 30 and the outer surface 20a of the cover 20) of the chassis R facing the internal combustion engine 100. Because this exposed matrix has a metallic color, its infrared absorption coefficient is low. Meanwhile, the outer surface 20a on the side away from the internal combustion engine 100 is treated with a black coating, for example, for raising heat emissivity.

Hence, radiative heat transfer to the chassis R from the internal combustion engine 100, or from a high temperature heat source, can be reduced as the surface is a natural metallic surface with a low infrared absorption coefficient. At the same time, the heat transfer from the face of the chassis R (specifically the outer surface 20a of the cover 20) to the side away from the internal combustion engine 100 can be augmented as this surface has a coating exhibiting high heat emissivity.

As a result, the heat dissipation from the chassis R can be improved by lowering heat transfer from the external high temperature heat source 100 (high temperature substance) to the chassis R and by enhancing heat transfer inside the chassis R to the side opposite to the high temperature substance 100. It thereby becomes possible to cool heat dissipating electronic devices such as semiconductor switching devices mounted on the printed circuit board in the electronic control unit.

Of the outer surfaces 20a and 30a of the chassis R, the surface 30a is the natural metallic face of the metal which forms the chassis R, while the face to be subjected to a predetermined coating (black coating in FIG. 1 and FIG. 2) is limited to the other surface 20a. As a result, the function of decreasing heat transfer from the high temperature heat source 100 (high temperature substance), and increasing heat transfer through the chassis R to the side opposite to the high temperature substance 100, can be provided for the chassis R at a low cost.

The above surface treatment may be a white coating as an alternative to a black one. The coating may be a powder coating or an electrolytic coating, for example. As possible coatings, platings of black anodized aluminum and black chromates may be employed. The inner surfaces (specifically the inner surface 30b of the case 30 and inner surface 20b of the cover 20) of the chassis R are subject to surface treatment, such as a black coating, to increase infrared absorption.

Consequently, since the inner surface of the chassis R efficiently absorbs infrared, heat radiated from heat dissipating electronic devices 11, such as semiconductor switching devices mounted on the printed circuit board 10 of the electronic control unit 1, can be efficiently transferred to the chassis R. The operating temperature of the device can thereby be lowered.

The above black surface treatment may be a plating of black anodized aluminum and black chromate(s). If a black coating is employed in both outer and inner surfaces 20a, 20b of the cover 20, both emissivity and infrared absorption coefficients will be raised, and the surface treatment cost can be lowered as no masking for the cover 20 is required during the coating procedure.

[Second Embodiment]

Figure 3:
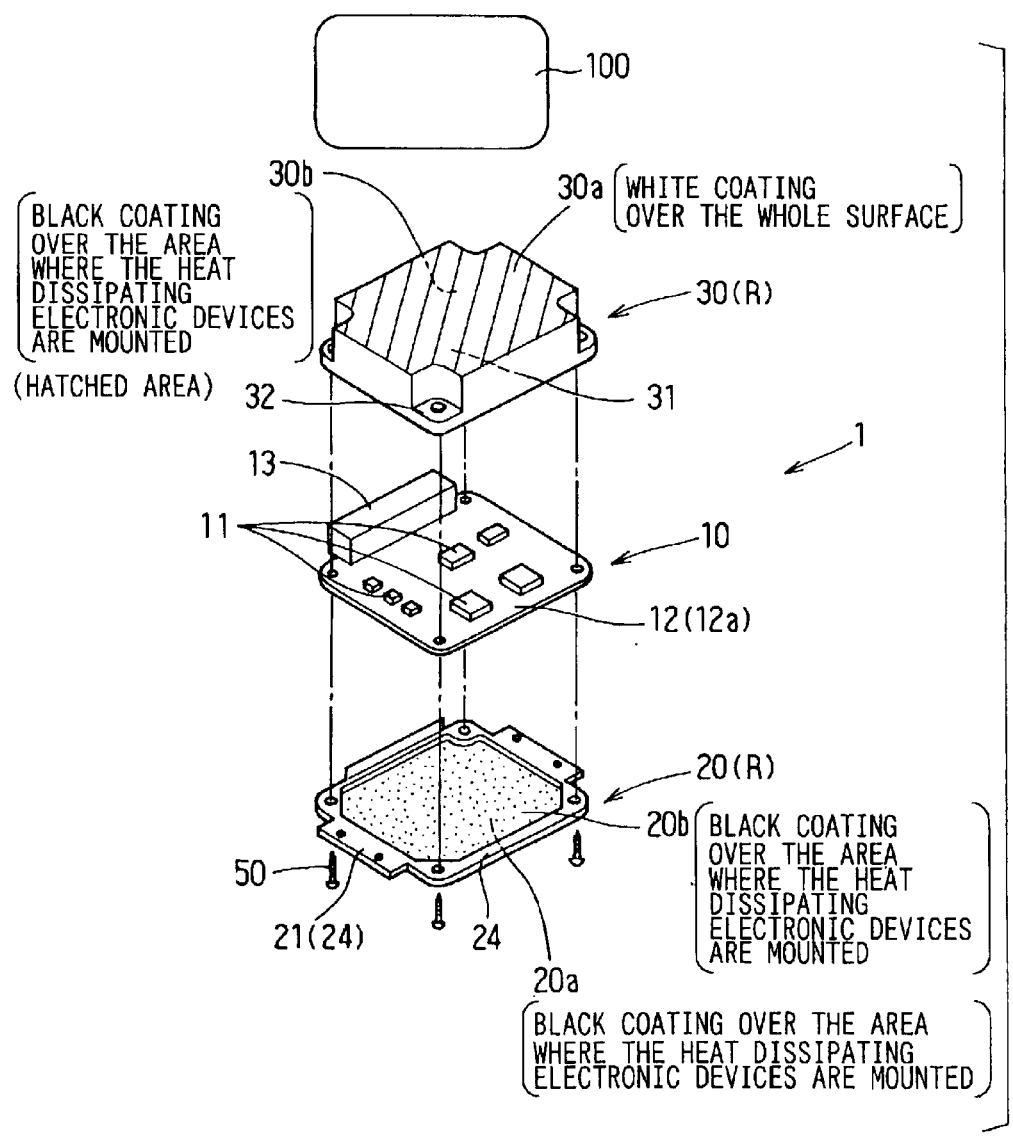
FIG. 3 is an exploded perspective view of the electronic control unit of a second embodiment of the invention.

FIG. 3 is an exploded perspective view of the electronic control unit in accordance with the second embodiment. In the second embodiment, the outer surface 30a (of the chassis R) on the side of the internal combustion engine 100 (as referred to in the first embodiment) is not a natural metallic face (presenting a metallic color) but a face subject to a surface treatment. The natural metallic surface of the metal forming the chassis R, which has a low infrared absorption ability, now has a white coating, for example, having a low absorption coefficient and a high emissivity. Accordingly, heat transfer from the chassis R to the outside can be accelerated. In addition to the reduction of heat transfer from the high temperature substance (to the chassis R) and the increase of heat transfer from the chassis to the side opposite to the high temperature substance, the function of increasing overall heat transfer from the chassis R to the outside is provided. Consequently, heat dissipation from the chassis R is accentuated.

Referring now to FIG. 3, with respect to inner surface 30b, and both outer and inner surfaces 20a and 20b of the cover 20, of the various surfaces of the chassis R (specifically the outer surface 30a and inner surface 30b of the case 30 and the outer surface 20a and inner surface 20b of the cover 20), only the regions facing the printed circuit board 10, and more particularly those facing the heat dissipating electronic devices, need to have a black coating. As a result, the amount of coating materials necessary for surface treatment can be reduced.

[Third Embodiment]

Figure 4:
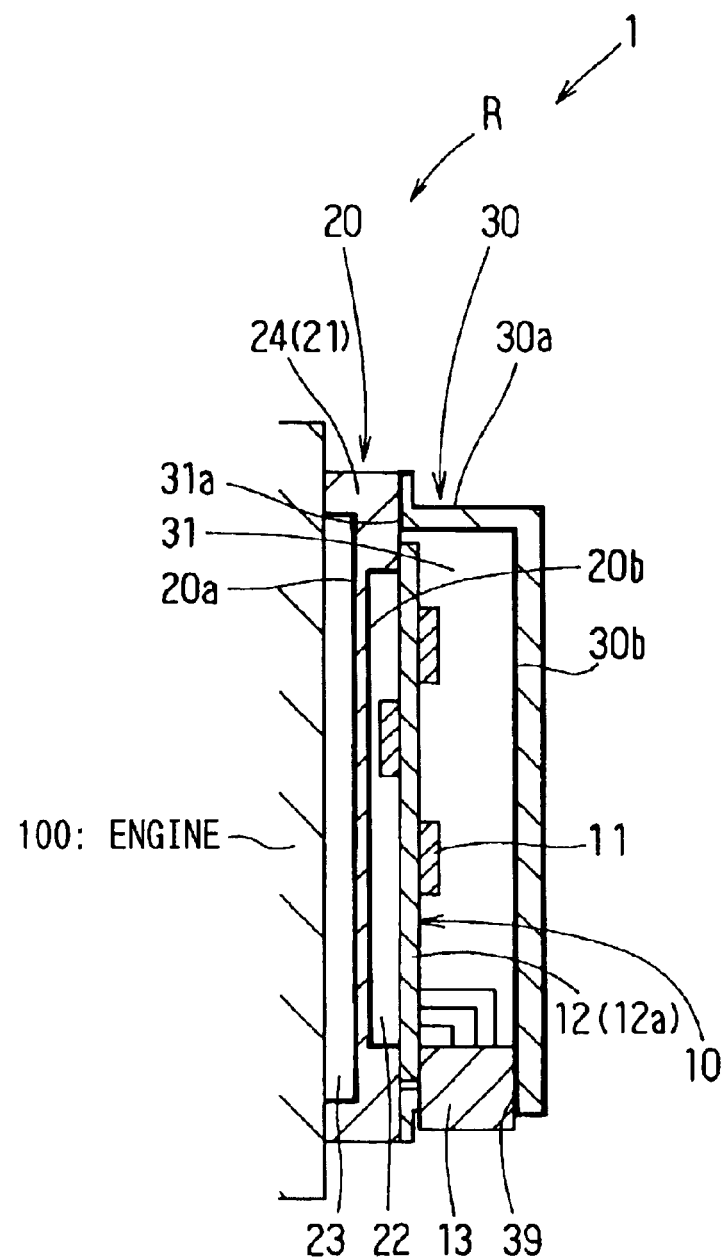
FIG. 4 is a cross-sectional view illustrating the structure of the electronic control unit of a third embodiment of the invention.

FIG. 4 is a cross-sectional view illustrating the structure of the electronic control unit in accordance with the third embodiment. In the third embodiment, the chassis R described in the first embodiment is mounted on the internal combustion engine 100, instead of the vehicle body 200, as is shown in FIG. 4.

With continued reference to FIG. 4, the outer surface 20a on the side facing the internal combustion engine 100, of the outer surfaces of the chassis R (specifically the outer surface 30a of the case 30 and the outer surface 20a of the cover 20), has a white coating, for example, possessing a low absorption coefficient and a high emissivity. On the other hand, the outer surface 30a on the side away from the internal combustion engine 100 has a black coating, for example, with a high emissivity. Then, as is the case with the first embodiment, the resulting chassis R decreases heat transfer to the chassis from the high temperature heat source 100 (high temperature substance), and increases heat transfer through the chassis R to the side opposite the high temperature source 100, for the electronic control unit 1. The resulting overall heat dissipation from the chassis R is thereby improved.

In addition, the inner surfaces (specifically the inner surface 30b of the case 30 and the inner surface 20b of the cover 20) of the chassis R have a black coating, for example, to raise infrared absorption properties. Then, as is the case with the first embodiment, as radiative heat transfer to the chassis R from the heat dissipating electronic devices 11 (mounted on the printed circuit board 10 of the electronic control unit 1) is enhanced, the device operating temperature can be lowered.

Further, as shown in FIG. 4, if a black coating is employed on both outer and inner surfaces 30a, 30b of the case 30, both emissivity and infrared absorption coefficients are raised. At the same time the surface treatment cost can be lowered as no masking for the case 30 is needed during the coating.

On the outer and inner surfaces 20a, 20b of the cover 20, only those regions facing the printed circuit board 10 may have a black coating (inner surface 20b), as shown in FIG. 4. Accordingly, the quantity of coating materials necessary for surface treatment can be reduced.

[Fourth Embodiment]

Figure 5:
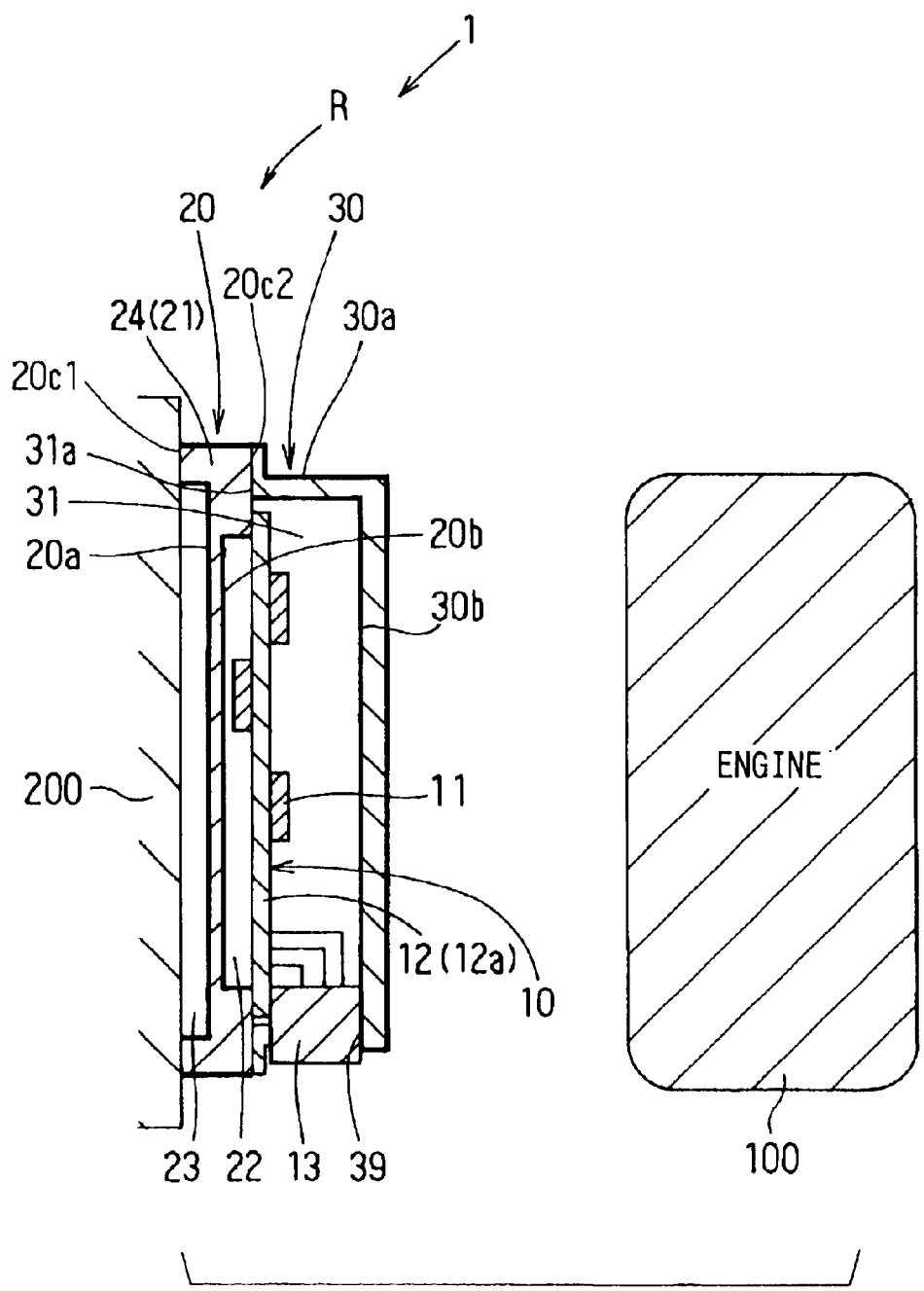
FIG. 5 is a cross-sectional view illustrating the structure of the electronic control unit of a fourth embodiment of the invention.

The fourth embodiment focuses on the surfaces of the chassis R (specifically the cover 20 and the case 30 described in the first embodiment) in surface contact with other components. For example, as shown in FIG. 5, the contacting areas 20c1 and 20c2 of the cover 20 in contact with other components on the side away from the internal combustion engine 100, have no surface treatment. This lack of surface treatment accelerates heat conduction between the contacting components.

Figure 6:
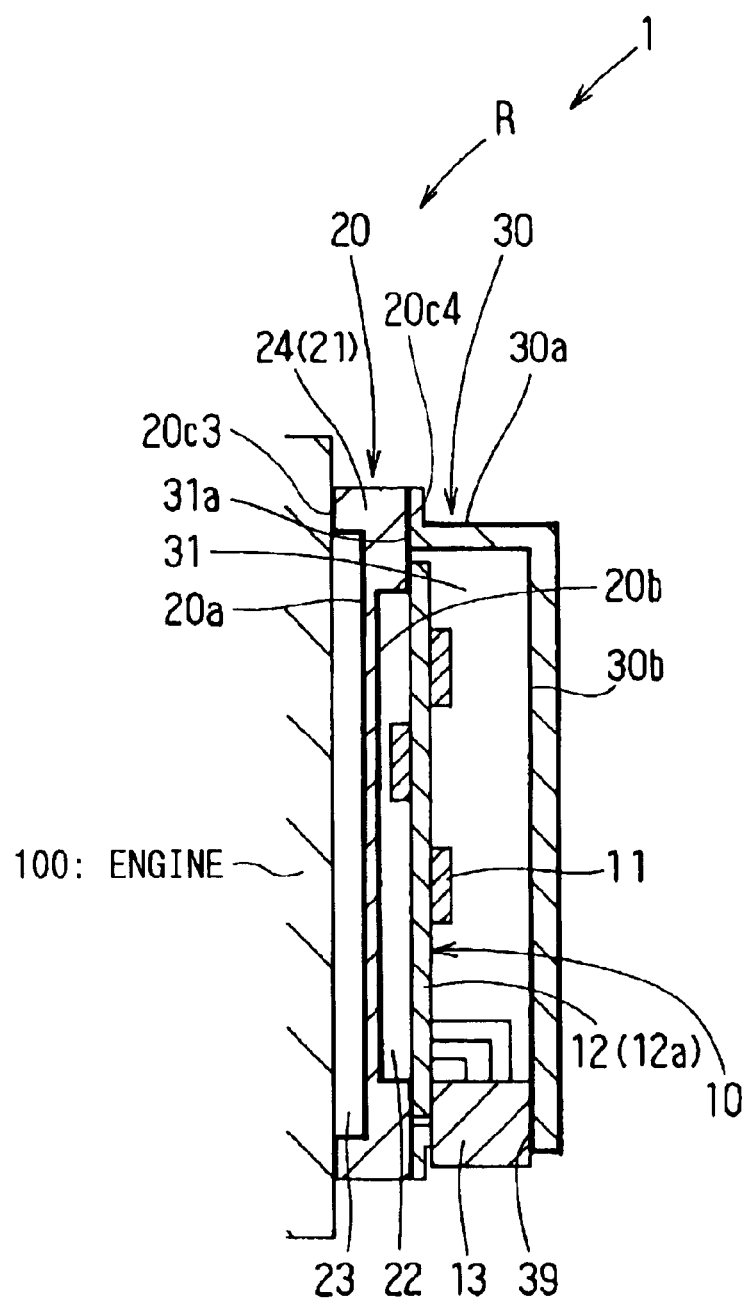
FIG. 6 is a cross-sectional view of the electronic control unit showing a variation of the invention.

On the other hand, FIG. 6 shows a variation of the invention in which the surfaces of contacting areas 20c3 and 20c4 (of the cover 20 on the side of the internal combustion engine 100) in contact with other components may be treated to reduce heat conduction with the components.

Figure 7:
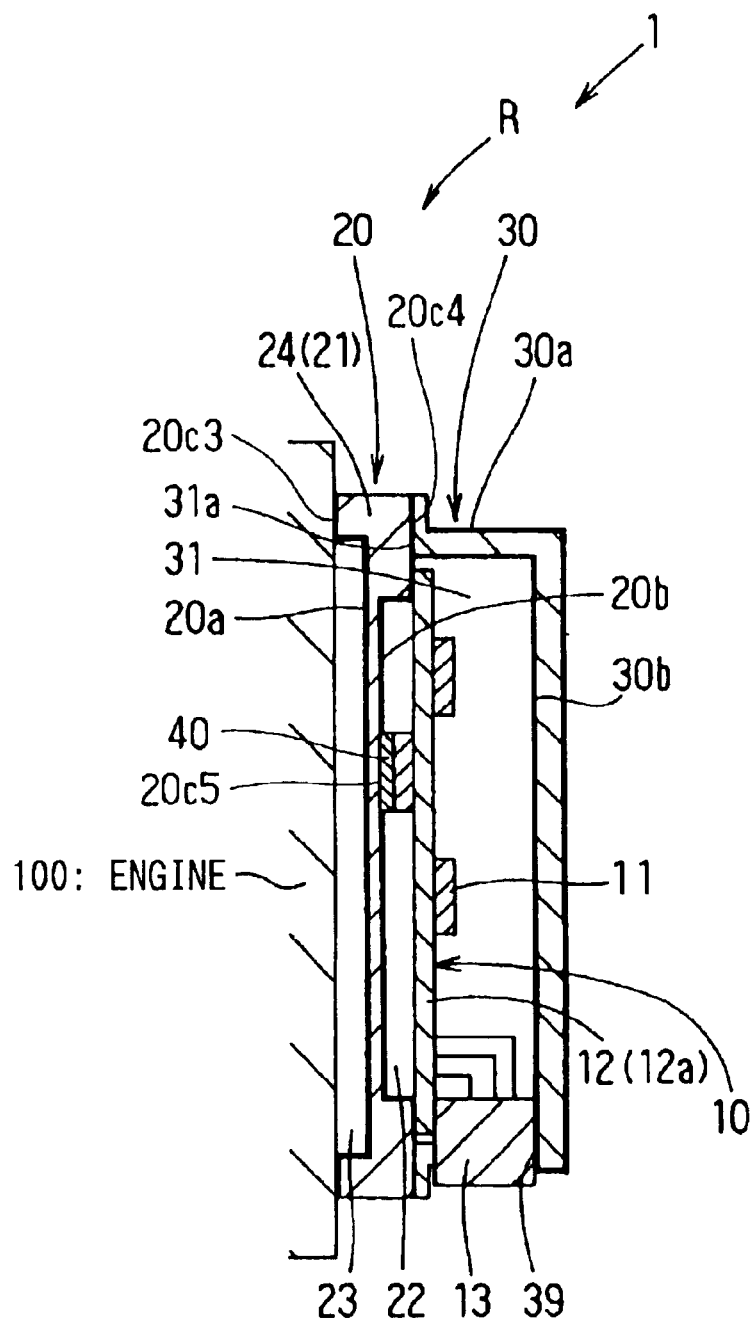
FIG. 7 is a cross-sectional view of the electronic control unit showing a variation of the invention.

Further, in another variation of the invention as shown in FIG. 7, if a heat dissipation unit 40 is employed to directly transfer heat from heat dissipating electronic devices 11, mounted on the printed circuit board 10, to the cover 20, the surface of the contacting area 20c5 in contact with the heat dissipating unit 40 of the cover 20 need not be treated. Not treating the contact area 20c5 enhances heat conduction between the heat dissipation unit 40 and the cover 20.

In this way, depending on the installation environment of the electronic control unit 1, the heat transfer from the high temperature heat source 100 to the chassis R can be reduced, while at the same time the heat transfer to the side away from the high temperature heat source 100 can be enhanced. By way of example, the chassis R can be partitioned into a plurality of segments and the partitioned chassis R can be efficiently cooled.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An electronic control unit to be installed proximate to a high temperature heat source, the electronic control unit comprising:
   a chassis incorporating a circuit board where electronic devices are mounted, wherein
   an outer surface of said chassis to be installed on a side facing said high temperature heat source has a lower heat absorption/emissivity coefficient than the outer surface of said chassis to be installed on a side facing away from said high temperature heat source.

2. The electronic control unit as in claim 1, wherein said high temperature heat source is an internal combustion engine providing a thermal load that changes with operating conditions.

3. The electronic control unit as in claim 1, wherein one of said outer surfaces of the chassis is an untreated surface of the material forming said chassis and the other outer surface incorporates a predetermined surface treatment.

4. The electronic control unit as in claim 2, wherein one of said outer surfaces of the chassis is an untreated surface of the material forming said chassis and the other outer surface incorporates a predetermined surface treatment.

5. The electronic control unit as in claim 1, wherein both said outer surfaces of said chassis incorporate surface treatments but differing from each other.

6. The electronic control unit as in claim 2, wherein both said outer surfaces of said chassis incorporate surface treatments but differing from each other.

7. The electronic control unit as in claim 1, wherein an inner cavity surface of said chassis incorporates a surface treatment for increasing its infrared absorption coefficient.

8. The electronic control unit as in claim 2, wherein an inner cavity surface of said chassis incorporates a surface treatment for increasing its infrared absorption coefficient.

9. The electronic control unit as in claim 3, wherein an inner cavity surface of said chassis incorporates a surface treatment for increasing its infrared absorption coefficient.

10. The electronic control unit as in claim 4, wherein an inner cavity surface of said chassis incorporates a surface treatment for increasing its infrared absorption coefficient.

11. The electronic control unit as in claim 5, wherein an inner cavity surface of said chassis incorporates a surface treatment for increasing its infrared absorption coefficient.

12. The electronic control unit as in claim 6, wherein an inner cavity surface of said chassis incorporates a surface treatment for increasing its infrared absorption coefficient.

13. The electronic control unit as in claim 1, wherein:
   on each of a plurality of chassis surfaces on a chassis side component including said outer surface to be installed facing said high temperature heat source, an area in surface contact with another component incorporates a surface treatment for decreasing heat conduction, and
   on each of a plurality of chassis surfaces on a chassis side component including said outer surface to be installed facing away from said high temperature heat source, an area in surface contact with another component incorporates a surface treatment for increasing heat conduction.

14. The electronic control unit as in claim 6, wherein:
   on each of a plurality of chassis surfaces on a chassis side component including said outer surface to be installed facing said high temperature heat source, an area in surface contact with another component incorporates a surface treatment for decreasing heat conduction, and
   on each of a plurality of chassis surfaces on a chassis side component including said outer surface to be installed facing away from said high temperature heat source, an area in surface contact with another component incorporates a surface treatment for increasing heat conduction.

15. The electronic control unit as in claim 12, wherein:
   on each of a plurality of chassis surfaces on a chassis side component including said outer surface to be installed facing said high temperature heat source, an area in surface contact with another component incorporates a surface treatment for decreasing heat conduction, and
   on each of a plurality of chassis surfaces on a chassis side, component including said outer surface to be installed facing away from said high temperature heat source, an area in surface contact with another component incorporates a surface treatment for increasing heat conduction.

16. The electronic control unit as in claim 1, wherein said chassis comprises a first housing unit holding said circuit board and a second housing unit, incorporating said circuit board, in combination with said first housing unit.

17. The electronic control unit as in claim 15, wherein said chassis comprises a first housing unit, holding said circuit board, and a second housing unit, incorporating said circuit board in combination with said first housing unit.

18. An electronic control unit for controlling an engine, the electronic control unit comprising:
- a circuit board on which is mounted at least one electronic component including a heat generating element;
- a cover made of a metallic material that supports the circuit board; and
- a metallic case that contains the circuit board together with the covering,
- the cover and the case forming a chassis having an inner cavity surface incorporating a high infrared absorption coefficient treatment,
- a heat conductive material disposed to transfer heat from the electronic component mounted on the circuit board to the chassis, and
- a contacting point between the heat conductive material and the chassis being processed to have a relatively higher heat conductivity than other portions of the chassis.

19. A method for improved cooling of electronic control unit components located in a chassis housing that is to be mounted proximate a high temperature heat source, said method comprising:
- surface treating at least one outer surface of the chassis housing so as to cause a first side to be mounted most proximate the heat source to have a lower heat absorption/emissivity coefficient than a second other side of the chassis housing.

20. A method as in claim 19 wherein said surface treatment is effected on said second other side.

21. A method as in claim 19 wherein said first and second sides are each subjected to predetermined but differing surface treatments.

22. A method as in claim 19 wherein said chassis housing has at least one internal cavity surface incorporating surface treatment for increasing its infrared absorption coefficient.

23. A method as in claim 19 wherein said chassis housing comprises plural components fastened together at first joint areas and wherein at least one of said components is adapted to be fastened to said high temperature heat source at second joint areas, said method further comprising:
- surface treating at least one of said first joint areas so as to increase its heat conduction coefficient; and
- surface treating at least one of said second joint areas to decrease its heat conduction coefficient.

* * * * *

UNITED STATES PATENT AND TRADEMARK OFFICE
CERTIFICATE OF CORRECTION

PATENT NO. : 6,867,968 B2
DATED : March 15, 2005
INVENTOR(S) : Katsuro et al.

It is certified that error appears in the above-identified patent and that said Letters Patent is hereby corrected as shown below:

Column 10,
After line 27, please add the following claims:

24. An electronic control unit for controlling an engine, the electronic control unit comprising:

a circuit board on which is mounted at least one electronic component including a heat generating element;

a cover made of a metallic material that supports the circuit board; and a metallic case that contains the circuit board together with the cover, the case having an outer surface and an inner surface incorporating a high infrared absorption coefficient treatment, a heat conductive material disposed to transfer heat from the electronic component mounted on the circuit board to the cover, a contacting point between the heat conductive material and the cover being processed to have a relatively higher heat conductivity than the case, and a fixing portion formed in the cover to fix the cover to a vehicular body.

25. An electronic control unit as in claim 24 wherein the electronic control unit is installed in an engine compartment of a vehicular body.

26. An electronic control unit as in claim 24 wherein the inner surface of the cover incorporates a high infrared absorption coefficient treatment.

27. An electronic control unit as in claim 25 wherein the inner surface of the cover incorporates a high infrared absorption coefficient treatment.

Signed and Sealed this

Fifth Day of July, 2005

JON W. DUDAS
*Director of the United States Patent and Trademark Office*